(12) United States Patent
Rencs et al.

(10) Patent No.: US 9,500,787 B2
(45) Date of Patent: Nov. 22, 2016

(54) MASKED PIXEL ARRAYS

(71) Applicant: Goodrich Corporation, Charlotte, NC (US)

(72) Inventors: Erik V. Rencs, Carlisle, MA (US); Jennifer S. Richardson, Westford, MA (US)

(73) Assignee: Goodrich Corporation, Charlotte, NC (US)

( * ) Notice: Subject to any disclaimer, the term of this patent is extended or adjusted under 35 U.S.C. 154(b) by 90 days.

(21) Appl. No.: 14/259,543

(22) Filed: Apr. 23, 2014

(65) Prior Publication Data

US 2015/0309223 A1    Oct. 29, 2015

(51) Int. Cl.
| | |
|---|---|
| *H04N 5/335* | (2011.01) |
| *H04N 5/228* | (2006.01) |
| *G02B 5/20* | (2006.01) |
| *H01L 27/146* | (2006.01) |
| *H04N 5/225* | (2006.01) |
| *H04N 5/357* | (2011.01) |

(52) U.S. Cl.
CPC ........... *G02B 5/208* (2013.01); *H01L 27/1462* (2013.01); *H01L 27/14603* (2013.01); *H01L 27/14621* (2013.01); *H01L 27/14623* (2013.01); *H01L 27/14625* (2013.01); *H01L 27/14645* (2013.01); *H04N 5/2254* (2013.01); *H04N 5/335* (2013.01); *H04N 5/357* (2013.01)

(58) Field of Classification Search
CPC ..................... H04N 13/0217; H04N 13/0214; H04N 5/2254; H04N 9/045; H04N 13/0221; H04N 13/025; H04N 5/33; G01N 21/9501; G01N 2021/8835; G01N 2021/8845; G03B 35/12; B23K 26/032; G06T 7/0065; A61B 1/00186
See application file for complete search history.

(56) References Cited

U.S. PATENT DOCUMENTS

| | | |
|---|---|---|
| 3,971,065 A | 7/1976 | Bayer |
| 5,914,749 A | 6/1999 | Bawolek et al. |

(Continued)

FOREIGN PATENT DOCUMENTS

| | | |
|---|---|---|
| EP | 2518770 A1 | 10/2012 |
| WO | WO-2008097705 A1 | 8/2008 |

OTHER PUBLICATIONS

European Search Report for Application No. 15164540.5 Dated Sep. 17, 2015.

*Primary Examiner* — Trung Diep
(74) *Attorney, Agent, or Firm* — Locke Lord LLP; Scott D. Wofsy; Joshua L. Jones

(57) ABSTRACT

An optical sensor includes an array of pixels configured to convert photons into electrons for forming an image or to measure spectral content without forming an image. A filter assembly is operatively associated with the array of pixels for passing predetermined bandwidths of photons to the array of pixels. A mask is operatively associated with the array of pixels and the filter assembly. The mask includes a plurality of apertures each for limiting photons passing through the filter assembly to a respective pixel in the array of pixels.

4 Claims, 2 Drawing Sheets

(56) References Cited

U.S. PATENT DOCUMENTS

| | | | | |
|---|---|---|---|---|
| 5,986,767 | A * | 11/1999 | Nakano | G01J 3/524 356/416 |
| 7,227,121 | B2 * | 6/2007 | Douglas | G01C 15/006 250/208.2 |
| 7,656,531 | B2 * | 2/2010 | Wang | G01M 11/0207 356/418 |
| 2005/0103983 | A1 | 5/2005 | Yamaguchi et al. | |
| 2005/0146634 | A1 * | 7/2005 | Silverstein | H04N 9/045 348/360 |
| 2005/0146663 | A1 * | 7/2005 | Kim | G02F 1/1393 349/130 |
| 2006/0278948 | A1 | 12/2006 | Yamaguchi et al. | |
| 2012/0236121 | A1 * | 9/2012 | Park | H04N 13/0271 348/46 |
| 2012/0281072 | A1 * | 11/2012 | Georgiev | G03B 11/00 348/49 |

* cited by examiner

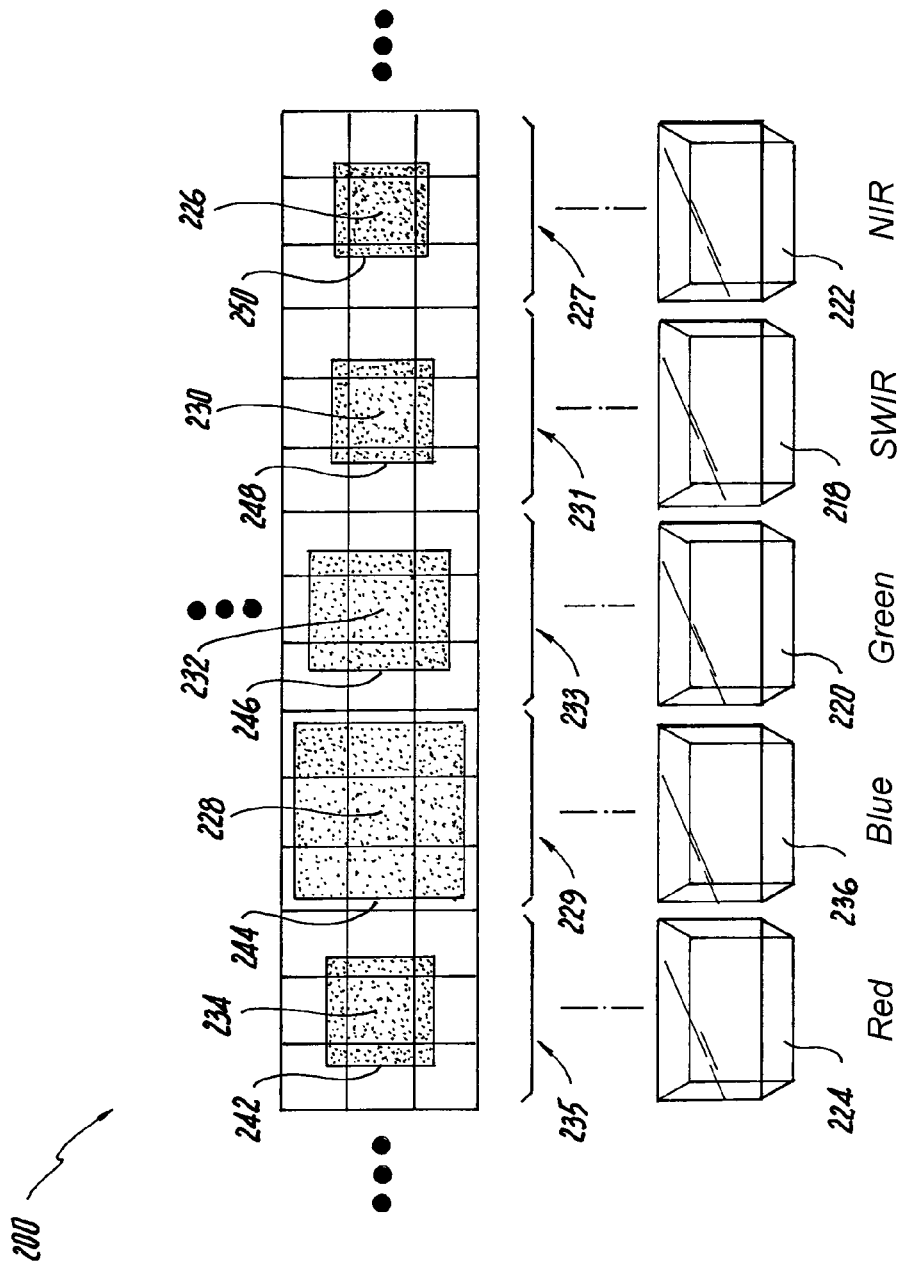

MASKED PIXEL ARRAYS

BACKGROUND OF THE INVENTION

1. Field of the Invention

The present disclosure relates to imaging devices, and more particularly to imaging devices for forming multi-chromatic images or multi-spectral measurements.

2. Description of Related Art

Photosensors can be used to make monochromatic images, wherein the pixels collect photons and convert light energy into electrons. A monochrome image can be formed by reading all of the electrons from an array of pixels to determine how much light was incident on each pixel. Such a device is commonly referred to as a focal plane array (FPA). In addition, the FPA can be used to measure spectral content without forming an image.

Multi-chromatic images can be made using optical filters to filter different colors of light for different pixels. For example, a photosensor having a color filter array with RGB color filters on a square grid of pixels can be arranged in a Bayer pattern as taught in U.S. Pat. No. 3,971,065. The raw image data can be developed into a full color image using interpolation algorithms.

Given the performance of a traditional monochrome FPA, traditional multi-chromatic optical sensors have to trade color selectivity for less sensitivity and more noise, ultimately limiting image quality. Limited image quality can ultimately limit the amount of information contained in an image. There is an ever present need in the art for optical sensors with increased color selectivity while maintaining maximum possible sensitivity with low noise as well as good spatial and temporal resolution. The present disclosure provides a solution for this need.

SUMMARY OF THE INVENTION

An optical sensor includes an array of pixels configured to convert photons into electrons for forming an image. A filter assembly is operatively associated with the array of pixels for passing predetermined bandwidths of photons to the array of pixels. A mask is operatively associated with the array of pixels and the filter assembly. The mask includes a plurality of apertures each for limiting photons passing through the filter assembly to a respective pixel in the array of pixels.

In certain embodiments, the configuration of one aperture in the mask is different from the configuration of at least one other aperture in the mask. The filter assembly can include a plurality of filters, each operatively associated with a respective pixel in the array of pixels for passing photons of a predetermined bandwidth to the respective pixel.

As one example, it is contemplated that the array of pixels can include repeated patterns of four pixels, wherein the filter assembly includes a shortwave infrared (SWIR) filter for passing SWIR photons to a first one of the four pixels, a near infrared (NIR) filter for passing NIR photons to a second one of the four pixels, a red filter for passing red photons to a third one of the four pixels, and a green filter for passing green photons to a fourth one of the four pixels. The four pixels can be arranged in a two by two pixel array, wherein the red and green pixels are diagonal from one another across the array.

The dimensions of the apertures can be determined such that each pixel would have the same relative response, within 30%, while viewing a uniform, diffuse scene. This enables a single integration time setting for the FPA while yielding a balanced output across the array.

As another example, it is contemplated that the array of pixels can include five pixels, wherein the filter assembly includes a SWIR filter for passing SWIR photons to a first one of the five pixels, a NIR filter for passing NIR photons to a second one of the five pixels, a red filter for passing red photons to a third one of the five pixels, a green filter for passing green photons to a fourth one of the five pixels, and a blue filter for passing blue photons to a fifth one of the five pixels. The SWIR filter, NIR filter, red filter, green filter, and blue filter can be aligned in a row with one another.

In another aspect, an optical sensor includes an array of pixels configured to convert photons into electrons for forming an image and a filter assembly operatively associated with the array of pixels for passing predetermined bandwidths of photons to the array of pixels. The filter assembly includes a plurality of filters defining an intra-filter space therebetween. A mask is defined within the intra-filter space to prevent photon leakage from one filter to another.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 2 is a schematic exploded view of another exemplary embodiment of an optical sensor constructed in accordance with the present disclosure, showing an array of pixels with corresponding mask apertures and filters for five pixels.

DETAILED DESCRIPTION OF THE PREFERRED EMBODIMENTS

Figure 1:
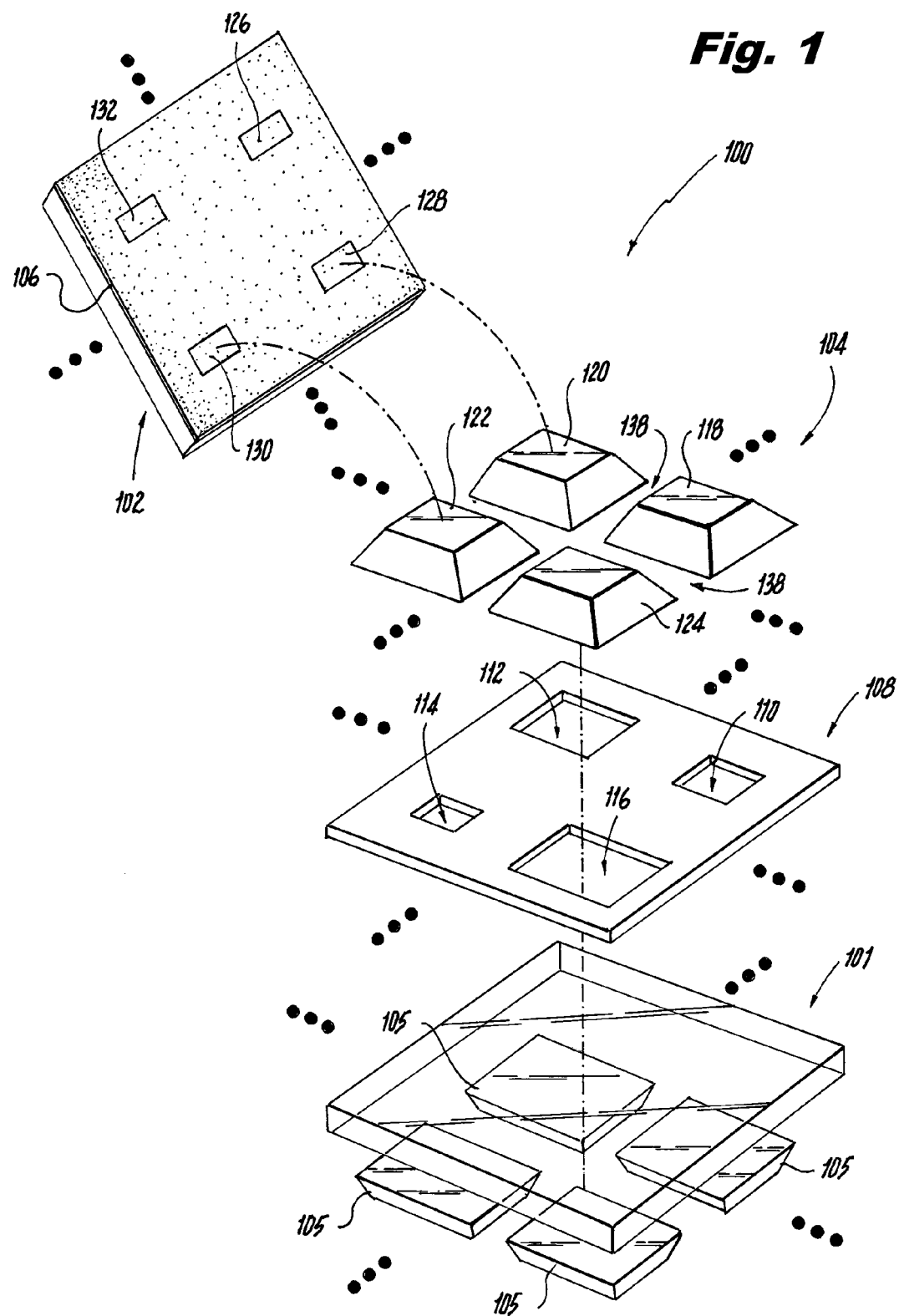
FIG. 1 is a schematic exploded perspective view of an exemplary embodiment of an optical sensor constructed in accordance with the present disclosure, showing an array of four pixels, a filter assembly, and a mask with a plurality of apertures for limiting photons passing through the filter assembly to respective pixels in the array of pixels.

Reference will now be made to the drawings wherein like reference numerals identify similar structural features or aspects of the subject disclosure. For purposes of explanation and illustration, and not limitation, a partial view of an exemplary embodiment of an optical sensor in accordance with the disclosure is shown in FIG. 1 and is designated generally by reference character 100. Another embodiment of an imaging sensor in accordance with the disclosure is provided in FIG. 2, as will be described. The systems and methods described herein can be used improve image quality. Four and five color imaging systems are described below wherein colors include colors that may not be visible to the human eye, but which nonetheless can be used to add information to an image, e.g. a false color image. Two such exemplary colors are shortwave infrared (SWIR) and near-infrared (NIR).

Optical sensor 100 includes an array of pixels 102 configured to convert photons into electrons for forming an image. A filter assembly 104 is operatively associated with the array of pixels 102 for passing predetermined bandwidths of photons to the array of pixels 102. For example, filter assembly 104 can be adhered to the array of pixels 102 with a transparent layer of adhesive 106 as indicated by the assembly lines in FIG. 1. A mask 108 is operatively associated with the array of pixels 102 and the filter assembly 104. Mask 108 can be formed on an optical substrate 101 and includes a plurality of apertures 110, 112, 114, and 116 each for limiting photons passing through filter assembly 104 to a respective pixel 126, 128, 130, and 132 in the array of pixels 102. The configuration of each aperture 110, 112, 114, and 116 is different from the others based on pixel color and performance characteristics, as described below, although it is contemplated that in certain applications some of the apertures may be identical in configuration, e.g., if the array includes multiple pixels of the same color.

The filters 118, 120, 122, and 124 are deposited on top of aperture mask 108, which is itself deposited on the optical substrate 101. In short, filter assembly 104 includes filters 118, 120, 122, 124, mask 108, and optical substrate 101. Filters 118, 120, 122, and 124 are operatively associated with respective pixels 126, 128, 130, and 132 in the array of pixels 102 for passing photons of a predetermined bandwidth to the respective pixel 126, 128, 130, or 132. Optionally, pre-filters 105 can be included, wherein filters 118, 120, 122, and 124 are implemented in a two stage manner, wherein pre-filters 105 are placed on the opposite side of optical substrate 101 from filters 118, 120, 122, and 124 to provide a thicker filter or at another location in the optical path.

As a non-limiting example, filter 118 is a SWIR filter for passing SWIR photons to pixel 126. Aperture 110 of mask 108 is aligned with filter 118 and limits photons passing through the filter 118. In this example, aperture 110 has dimensions such that the signal to noise ratio for pixel 126 is the same as the other pixel/filter combinations on the array of pixels 102 to within 30%. Filter 120 is a filter for passing visible light photons, e.g., a green filter, to pixel 128 in the array of pixels 102. Aperture 112 is aligned with filter 120 and pixel 128 to limit photons passing through the filter 120. In this example, aperture 112 has dimensions such that the signal to noise ratio for pixel 128 is the same as the other pixel/filter combinations on the array of pixels 102 to within 30%. Filter 122 is a filter for passing NIR photons to pixel 130 in the array of pixels 102. Aperture 114 is aligned with filter 122 and pixel 130 to limit photons passing through the NIR filter and has dimensions such that the signal to noise ratio of pixel 130 is the same as the other pixel/filter combinations on the array of pixels 102 to within 30%. Filter 124 is a filter for passing visible light photons, e.g., a red filter, to pixel 132. Aperture 116 is aligned with filter 124 and pixel 132 to limit photons passing through the filter 124. Aperture 116 has dimensions such that the signal to noise ratio for pixel 130 is the same as the other pixel/filter combinations on the array of pixels 102 to within 30%. It is contemplated that the corner features of the rectangular apertures 110, 112, 114, and 116 can be radius fillets for enhanced manufacturability.

In short, the pixel pattern in optical sensor 100 is of four pixels arranged in a two pixel by two pixel array, wherein the red and green pixels are diagonal from one another across the array. The dimensions of the apertures can be determined such that each pixel would have the same relative response, within 30%, while viewing a uniform, diffuse scene. This enables a single integration time setting for the FPA while yielding a balanced output across the array. The ellipses in FIG. 1 schematically indicate that this four pixel pattern can be tiled or repeated over a focal plane, e.g., to provide for multiple megapixels.

Optical sensor 100 provides for four color images, namely images that include red, green, SWIR, and NIR components. With reference to FIG. 2, another exemplary optical sensor 200 is shown for producing five-color images, adding blue to the four colors included in optical sensor 100. In optical sensor 200, the array of pixels 202 includes five pixel groups 227, 229, 231, 233, and 235 of nine pixels each. Each pixel group includes a respective central pixel 226, 228, 230, 232, and 234 surrounded by eight peripheral pixels. In this example, the filter assembly includes a SWIR filter 218 for passing SWIR photons to pixel group 231, a NIR filter 222 for passing NIR photons to pixel group 227, a red filter 224 for passing red photons to pixel group 235, a green filter 220 for passing green photons to pixel group 233, and a blue filter 236 for passing blue photons to pixel group 229. The aperture mask shown in FIG. 2 includes apertures 242, 244, 246, 248, and 250 corresponding to filters 224, 236, 220, 218, and 222, respectively. Although not depicted in FIG. 2, it is to be understood that pre-filters such as those described above with respect to FIG. 1 can be included with sensor 200.

The relative aperture sizes for each filter and pixel are indicated by the relative sizes of apertures 242, 244, 246, 248, and 250 in FIG. 2. In this example, aperture 242 (red) can have dimensions such that the signal to noise ratio for pixel group 235 is the same as the other pixel group/filter combinations on the array of pixels 200 to within 30%. Likewise, aperture 244 (blue) can have dimensions such that the signal to noise ratio for pixel group 229 is the same as the other pixel group/filter combinations on the array of pixels 200 to within 30%; aperture 246 (green) can have dimensions such that the signal to noise ratio for pixel group 233 is the same as the other pixel group/filter combinations on the array of pixels 200 to within 30%; aperture 248 (SWIR) can have dimensions such that the signal to noise ratio for pixel group 231 is the same as the other pixel group/filter combinations on the array of pixels 200 to within 30%; and aperture 250 (NIR) can have dimensions such that the signal to noise ratio for pixel group 227 is the same as the other pixel group/filter combinations on the array of pixels 200 to within 30%. The aperture sizes provide for complete filter coverage of each of the central pixels 226, 228, 230, 232, and 234, and for partial coverage of the respective eight peripheral pixels of pixel groups 227, 229, 231, 233, and 235. The SWIR filter 218, NIR filter 222, red filter 224, green filter 220, and blue filter 236 are aligned in a row with one another. The ellipses in FIG. 2 indicate the five pixel group pattern of three-by-three pixel groups shown can be repeated, e.g., to tile over a focal plane for forming five-color images.

Those skilled in the art will readily appreciate that the aperture dimensions and shapes described herein are exemplary implementations, and that any other suitable configurations can be used for given applications dependent on illumination, target, and pixel performance details.

Referring again to FIG. 1, in optical sensor 100, the individual filters 118, 120, 122, and 124 of filter assembly 104 each define a respective structure that is generally pyramidal. More specifically, each of the filters 118, 120, 122, and 124 is formed by layering multiple layers of optical film of different thicknesses and properties into a stack. During the layering process, each successive layer is smaller than the previous layer as is characteristic of using standard deposition techniques. The resulting structure of filter assembly 104 is a block of four filters 118, 120, 122, and 124 in the shape of truncated, stepped pyramids with an intra-filter space 138 defined between the pyramids of filters 118, 120, 122, and 124. The steps on the sides of the pyramids are not shown in FIG. 1 due to clarity at the scale shown, e.g., where about 400 layers can be used to create an individual filter. A mask is defined within the intra-filter space 138, which can be provided as a space filling mask, or a coating applied on the sloping faces of the filters. It is also contemplated that the mask in intra-filter space 138 can be a thin coating on the sloped surfaces of the filters and the surface between the filter structures coating the aperture mask 108.

The exemplary sensor configurations described herein are based on illumination conditions and FPA characteristics for applications utilizing SWIR and NIR imaging. Those skilled in the art will readily appreciate that modifications can be made, e.g., different pixel color choices, different numbers of pixel colors, and the like, as needed on an application by application basis. The distance between pixels is another design parameter that can be varied from application to application. The range is driven by filter performance, e.g. performance of a filter and pre-filter as a filter pair as described above. The design space also allows for considerable variation in filter substrate height, but as one example, the filter substrate height from the FPA in applications including SWIR and visible pixels will be about 6 μm to about 20 μm, e.g., 8 μm for sensor 100. Sensors without the techniques disclosed herein tend to offer reduced dynamic ranges, less color selectivity, and reduced optical signal to noise ratios.

The methods and systems of the present disclosure, as described above and shown in the drawings, provide for optical sensors with superior properties including improved imaging quality. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. An optical sensor comprising:
   an array of pixels configured to convert photons into electrons for forming an image;
   a filter assembly operatively associated with the array of pixels for passing predetermined bandwidths of photons to the array of pixels; and
   a mask operatively associated with the array of pixels and the filter assembly, wherein the mask includes a plurality of apertures each for limiting photons passing through the filter assembly to a respective pixel in the array of pixels,
   wherein the filter assembly includes at least one SWIR filter for passing SWIR photons to a respective pixel in the array of pixels,
   wherein one of the apertures limits photons passing through the SWIR filter and has dimensions such that signal to noise ratio for the respective pixel is the same as the other pixels on the array of pixels to within 30%,
   wherein the filter assembly includes at least one filter for passing visible light photons to the array of pixels,
   wherein one of the apertures limits photons passing through the visible light filter and has dimensions such that signal to noise ratio for the respective pixel is the same as the other pixels on the array of pixels to within 30%,
   wherein the filter assembly includes at least one filter for passing NIR photons to the array of pixels,
   wherein one of the apertures limits photons passing through the NIR filter and has dimensions of such that signal to noise ratio for the respective pixel is the same as the other pixels on the array of pixels to within 30%, and
   wherein the array of pixels includes four pixels, wherein the filter assembly includes a SWIR filter for passing SWIR photons to a first one of the four pixels, a NIR filter for passing NIR photons to a second one of the four pixels, a red filter for passing red photons to a third one of the four pixels, and a green filter for passing green photons to a fourth one of the four pixels.

2. An optical sensor as recited in claim 1, wherein the four pixels are arranged in a two by two pixel array, wherein the red and green pixels are diagonal from one another across the array.

3. An optical sensor as recited in claim 1, wherein the array of pixels includes five pixels, wherein the filter assembly includes a SWIR filter for passing SWIR photons to a first one of the five pixels, a NIR filter for passing NIR photons to a second one of the five pixels, a red filter for passing red photons to a third one of the five pixels, a green filter for passing green photons to a fourth one of the five pixels, and a blue filter for passing blue photons to a fifth one of the five pixels.

4. An optical sensor as recited in claim 3, wherein the SWIR filter, NIR filter, red filter, green filter, and blue filter are aligned in a row with one another.

* * * * *